United States Patent
Kappus et al.

(10) Patent No.: US 9,780,753 B2
(45) Date of Patent: Oct. 3, 2017

(54) ADAPTIVE EQUALIZATION FOR AN ULTRASONIC AUDIO SYSTEM

(71) Applicant: Turtle Beach Corporation, Poway, CA (US)

(72) Inventors: Brian Alan Kappus, San Diego, CA (US); Elwood Grant Norris, Poway, CA (US)

(73) Assignee: Turtle Beach Corporation, Poway, CA (US)

( * ) Notice: Subject to any disclaimer, the term of this patent is extended or adjusted under 35 U.S.C. 154(b) by 48 days.

(21) Appl. No.: 14/533,435

(22) Filed: Nov. 5, 2014

(65) Prior Publication Data

US 2016/0126916 A1    May 5, 2016

(51) Int. Cl.
*H03G 5/16*   (2006.01)
*H04R 17/00*  (2006.01)
*H04R 3/04*   (2006.01)
*H03G 3/00*   (2006.01)

(52) U.S. Cl.
CPC ............... *H03G 5/165* (2013.01); *H03G 3/00* (2013.01); *H04R 3/04* (2013.01); *H04R 17/00* (2013.01); *H04R 2217/03* (2013.01)

(58) Field of Classification Search
None
See application file for complete search history.

(56) References Cited

U.S. PATENT DOCUMENTS

| 2012/0076306 A1* | 3/2012 | Aarts | H04R 3/14 381/17 |
| 2013/0272543 A1* | 10/2013 | Tracey | H03G 3/32 381/107 |
| 2015/0222990 A1* | 8/2015 | Hansen | H04R 3/04 381/103 |

FOREIGN PATENT DOCUMENTS

| EP | 1248491 A2 | 9/2002 |
| JP | 2009290253 A | 10/2009 |
| WO | 2011025461 A1 | 3/2011 |

OTHER PUBLICATIONS

International Preliminary Report for PCTUS2015058635, dated May 18, 2017, 7 pages.
International Search Report and Written Opinion for PCTUS2015058635, dated Feb. 4, 2016, 10 pages.

\* cited by examiner

*Primary Examiner* — Curtis Kuntz
*Assistant Examiner* — Kenny Truong
(74) *Attorney, Agent, or Firm* — Sheppard Mullin; Daniel Yannuzzi; Jonathan Marina

(57) ABSTRACT

An ultrasonic audio system includes adaptive equalization techniques configured to adjust the overall output of the ultrasonic audio system. This can be done by adjusting the equalization of the electronic audio signal representing the audio content being reproduced by the ultrasonic audio system. For example, in various embodiments, systems and methods can be implemented to increase the gain of higher frequency portions of the electronic audio signal while making a corresponding decrease in the amount of gain at the lower frequency portions of the same signal.

15 Claims, 9 Drawing Sheets

ADAPTIVE EQUALIZATION FOR AN ULTRASONIC AUDIO SYSTEM

TECHNICAL FIELD

The present disclosure relates generally to parametric audio systems for a variety of applications. More particularly, some embodiments relate systems and methods for adaptive equalization in an ultrasonic audio system for output level control.

BACKGROUND OF THE INVENTION

Non-linear transduction results from the introduction of sufficiently intense, audio-modulated ultrasonic signals into an air column. Self-demodulation, or down-conversion, occurs along the air column resulting in the production of an audible acoustic signal. This process occurs because of the known physical principle that when two sound waves with different frequencies are radiated simultaneously in the same medium, a modulated waveform including the sum and difference of the two frequencies is produced by the non-linear (parametric) interaction of the two sound waves. When the two original sound waves are ultrasonic waves and the difference between them is selected to be an audio frequency, an audible sound can be generated by the parametric interaction.

Parametric audio reproduction systems produce sound through the heterodyning of two ultrasonic signals in a non-linear process that occurs in a medium such as air. The non-linearity of the medium results in the creation of audible sound produced in the medium that are the difference of the ultrasonic signals. Thus, two ultrasound signals that are separated in frequency result in a difference tone that is within the 20 Hz to 20,000 Hz range of human hearing.

The amount of power that can be used to drive an ultrasonic emitter is limited by a number of factors. These factors can include, for example, the amount of available power by the amplifier, the power level at which clipping occurs, the amount of power by which the emitters can be driven, and so on. Given these factors, the volume in which audio content can be played through an ultrasonic emitter is constrained to a maximum level. In order to increase output levels in ultrasonic audio systems, designers have typically relied on using higher power amplifiers and more robust or larger emitters. However, higher power amplifiers typically consume more energy and are more costly to produce, while more robust or larger emitters may also be more costly to produce and may suffer from other drawbacks such as poorer frequency response.

SUMMARY

Embodiments of the technology described herein include systems and methods for providing an ultrasonic audio system, including:

Embodiments of the systems and methods described herein can be configured to provide adaptive equalization techniques to an ultrasonic audio system. Conventionally, ultrasonic audio systems tend to have a somewhat linear response in that the system output tends to increase linearly as a function of frequency with a relatively constant power setting across the frequency range. This is discussed in detail below with reference to FIG. 3. In accordance with some embodiments, systems and methods can be implemented to adjust an inflection point of the ultrasonic audio system to adapt equalization of the system based on volume or attenuation settings. For example, an inflection point can be defined to identify a frequency crossover point for equalization settings. For example, at frequencies below the inflection point the equalization setting can be set so it does not affect those frequencies such that the output follows the response characteristics of the system; while at frequencies above the inflection point, the equalization setting can be set to decrease as frequency is increased such that the resulting output is relatively flat across those frequencies. For an increase in volume, inflection point can be raised to a higher frequency such that more power is provided to frequencies higher on the response curve. For a decrease in volume, the inflection point can be moved to a lower frequency such that less power is provided to the higher frequencies resulting in greater low frequencies at that volume setting. This results in unmasking of relative low frequency output from total frequency response.

In accordance with other embodiments of the systems and methods described herein ultrasonic audio systems can be configured to include adaptive equalization to adjust the overall output (e.g., adjust the volume) and relative low frequency output of the ultrasonic audio system. This can be done by adaptively adjusting the equalization of the electronic audio signal representing the audio content being reproduced by the ultrasonic audio system. For example, in various embodiments, systems and methods can be implemented to increase the gain of higher frequency portions of the electronic audio signal while making a corresponding decrease in the amount of gain at the lower frequency portions of the same signal. Where the amount of gain increase at the high frequencies equals the amount of gain decreased at low frequencies, the overall power output of the amplifier remains the same (or substantially the same) while, the overall output or volume of the reproduced audio signal increases. Accordingly, systems and methods can be implemented in which the overall output of the system can be increased without substantially increasing the amount of power used to drive the system. This can, in some embodiments, be implemented to achieve greater output or alternatively increasing relative low frequency output without materially increasing distortion or power requirements introduced by the system.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the accompanying figures. The drawings are provided for purposes of illustration only and merely depict typical or example embodiments of the invention. These drawings are provided to facilitate the reader's understanding of the systems and methods described herein, and shall not be considered limiting of the breadth, scope, or applicability of the claimed invention.

Some of the figures included herein illustrate various embodiments of the invention from different viewing angles. Although the accompanying descriptive text may refer to elements depicted therein as being on the "top," "bottom" or "side" of an apparatus, such references are merely descriptive and do not imply or require that the invention be implemented or used in a particular spatial orientation unless explicitly stated otherwise.

FIG. 6 is a diagram illustrating the output of the system as a function of frequency, and FIG. 7 is a diagram illustrating an example of an adaptive equalization scheme to control power (which can also include compression).

FIG. 8 is a diagram illustrating the output of the system as a function of frequency, and FIG. 9 is a diagram illustrating an example of an adaptive equalization scheme to control power (which can also include compression).

The figures are not intended to be exhaustive or to limit the invention to the precise form disclosed. It should be understood that the invention can be practiced with modification and alteration, and that the invention be limited only by the claims and the equivalents thereof.

DESCRIPTION

Embodiments of the systems and methods described herein provide adaptive equalization techniques to an ultrasonic audio system. In accordance with various embodiments of the systems and methods described herein ultrasonic audio systems can be configured to include adaptive equalization to adjust the overall output (e.g., adjust the volume) and relative low frequency output of the ultrasonic audio system. This can be done by adaptively adjusting the equalization of the electronic audio signal representing the audio content being reproduced by the ultrasonic audio system. For example, in various embodiments, systems and methods can be implemented to increase the gain of higher frequency portions of the electronic audio signal while making a corresponding decrease in the amount of gain at the lower frequency portions of the same signal. Where the amount of gain increase at the high frequencies equals the amount of gain decreased at low frequencies, the overall power output of the amplifier remains the same (or substantially the same) while, the overall output or volume of the reproduced audio signal increases. Accordingly, systems and methods can be implemented in which the overall output of the system can be increased without substantially increasing the amount of power used to drive the system. This can, in some embodiments, be implemented to achieve greater output or alternatively increasing relative low frequency output without materially increasing distortion introduced by the system.

Figure 1:
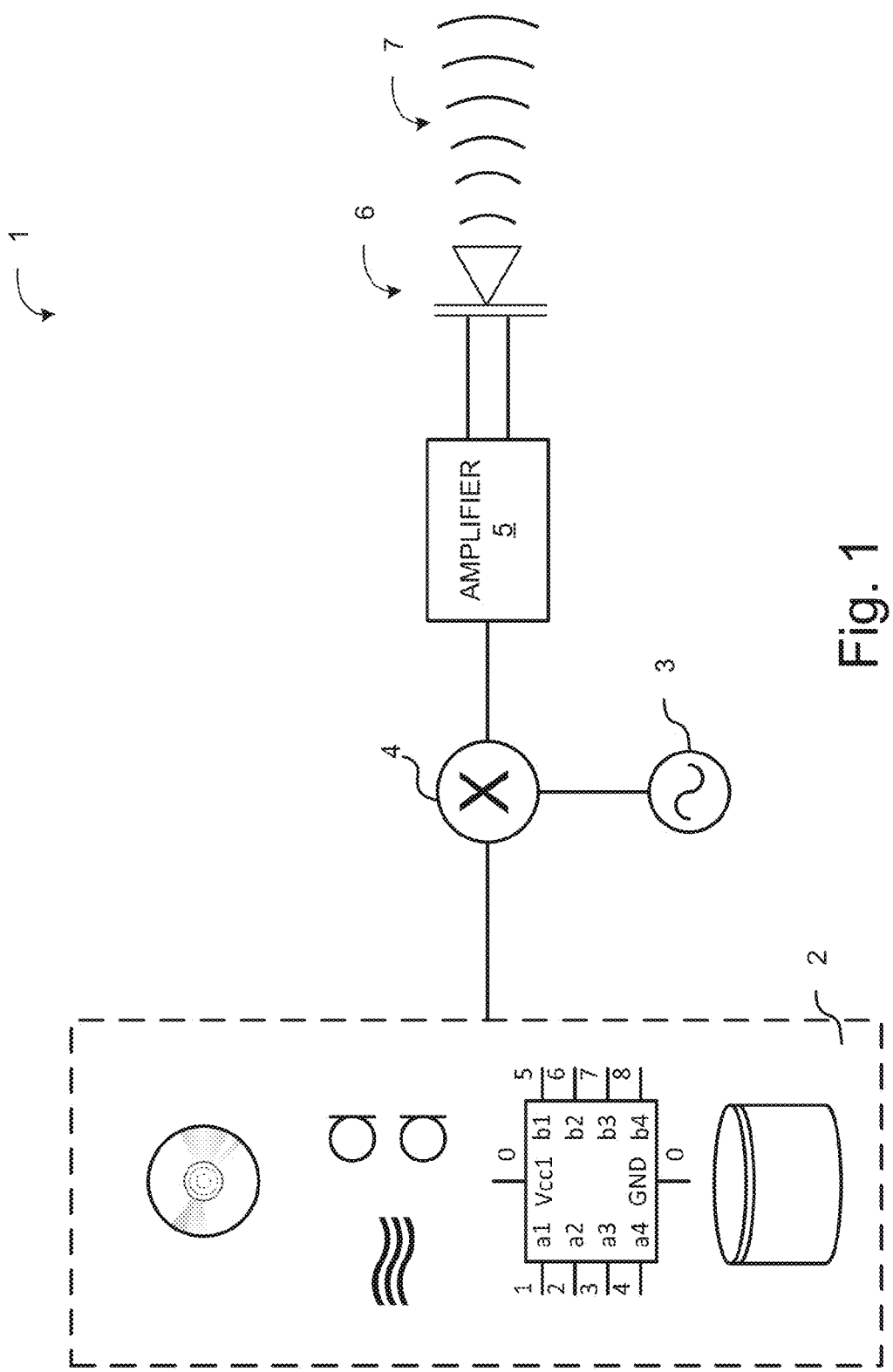
FIG. 1 is a diagram illustrating an ultrasonic sound system suitable for use with the emitter technology described herein.

FIG. 1 is a diagram illustrating an ultrasonic sound system suitable for use in conjunction with the systems and methods described herein. In this exemplary ultrasonic system 1, audio content from an audio source 2, such as, for example, a microphone, memory, a data storage device, streaming media source, MP3, CD, DVD, set-top-box, or other audio source is received. The audio content may be decoded and converted from digital to analog form, depending on the source. The audio content received by the audio system 1 is modulated onto an ultrasonic carrier of frequency f1, using a modulator. The modulator typically includes a local oscillator 3 to generate the ultrasonic carrier signal, and multiplier 4 to modulate the audio signal on the carrier signal. The resultant signal is a double- or single-sideband signal with a carrier at frequency f1 and one or more side lobes. In some embodiments, the signal is a parametric ultrasonic wave or a HSS signal. In most cases, the modulation scheme used is amplitude modulation, or AM, although other modulation schemes can be used as well. Amplitude modulation can be achieved by multiplying the ultrasonic carrier by the information-carrying signal, which in this case is the audio signal. The spectrum of the modulated signal can have two sidebands, an upper and a lower side band, which are symmetric with respect to the carrier frequency, and the carrier itself.

The modulated ultrasonic signal is provided to the transducer 6, which launches the ultrasonic signal into the air creating ultrasonic pressure wave 7. When played back through the transducer at a sufficiently high sound pressure level, due to nonlinear behavior of the air through which it is 'played' or transmitted, the carrier in the signal mixes with the sideband(s) to demodulate the signal and reproduce the audio content. This is sometimes referred to as self-demodulation. Thus, even for single-sideband implementations, the carrier is included with the launched signal so that self-demodulation can take place.

Although the system illustrated in FIG. 1 uses a single transducer, or emitter, to launch a single channel of audio content, one of ordinary skill in the art after reading this description will understand how multiple mixers, amplifiers and transducers can be used to transmit multiple channels of audio using ultrasonic carriers. The ultrasonic transducers can be mounted in any desired location depending on the application.

Figure 2:
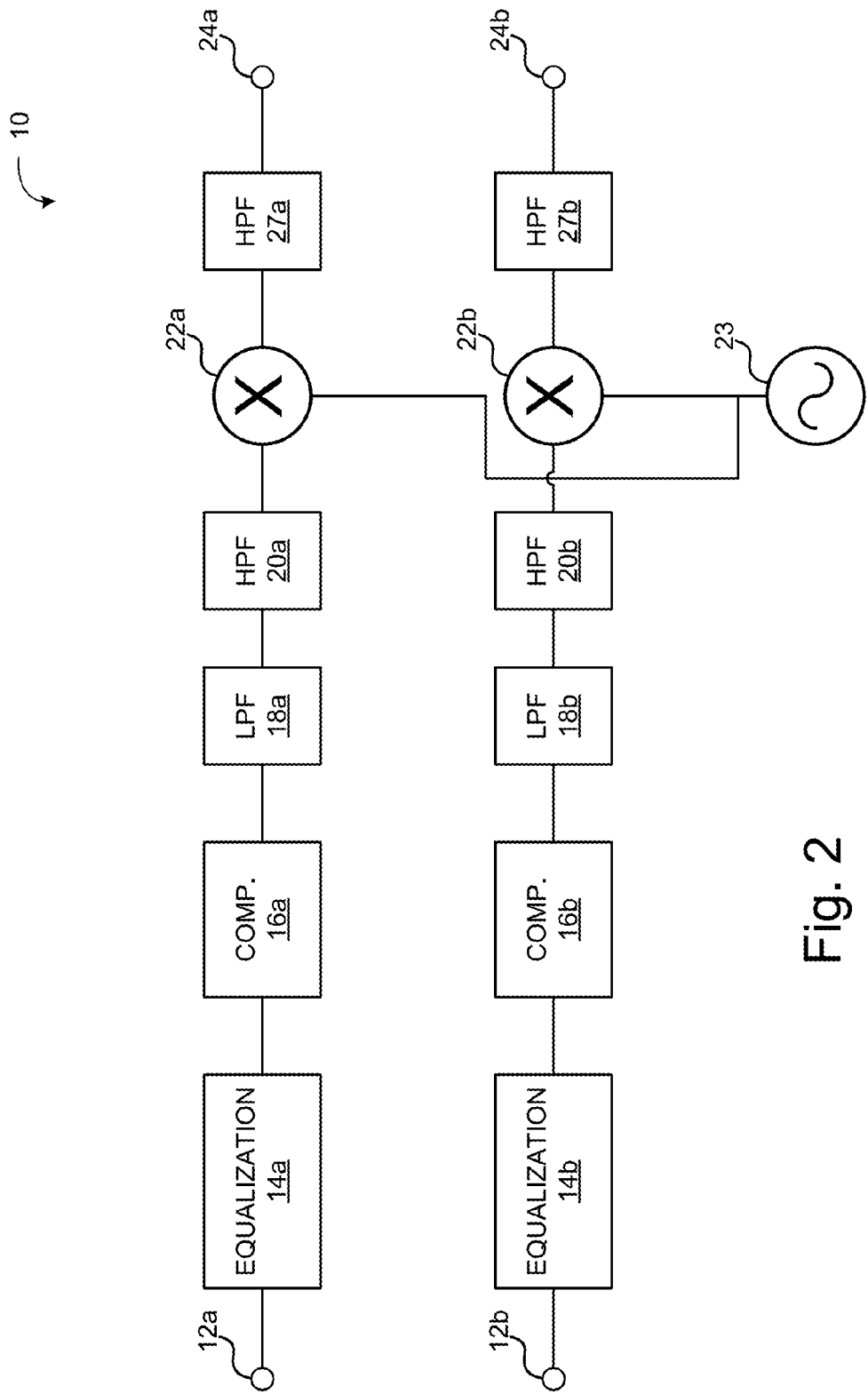
FIG. 2 is a diagram illustrating another example of a signal processing system that is suitable for use with the emitter technology described herein.

One example of a signal processing system 10 that is suitable for use with the technology described herein is illustrated schematically in FIG. 2. In this embodiment, various processing circuits or components are illustrated in the order (relative to the processing path of the signal) in which they are arranged according to one implementation. It is to be understood that the components of the processing circuit can vary, as can the order in which the input signal is processed by each circuit or component. Also, depending upon the embodiment, the processing system 10 can include more or fewer components or circuits than those shown.

Additionally, the example shown in FIG. 1 is optimized for use in processing two input and output channels (e.g., a "stereo" signal), with various components or circuits including substantially matching components for each channel of the signal. It will be understood by one of ordinary skill in the art after reading this description that the audio system can be implemented using a single channel (e.g., a "monaural" or "mono" signal), two channels (as illustrated in FIG. 2), or a greater number of channels.

Referring now to FIG. 2, the example signal processing system 10 can include audio inputs that can correspond to left 12a and right 12b channels of an audio input signal. Equalizing networks 14a, 14b can be included to provide equalization of the signal. The equalization networks can, for example, boost or suppress predetermined frequencies or frequency ranges to increase the benefit provided naturally by the emitter/inductor combination of the parametric emitter assembly.

After the audio signals are equalized compressor circuits 16a, 16b can be included to compress the dynamic range of the incoming signal, effectively raising the amplitude of certain portions of the incoming signals and lowering the amplitude of certain other portions of the incoming signals. More particularly, compressor circuits 16a, 16b can be included to narrow the range of audio amplitudes. In one aspect, the compressors lessen the peak-to-peak amplitude of the input signals by a ratio of not less than about 2:1. Adjusting the input signals to a narrower range of amplitude can be done to minimize distortion, which is characteristic of the limited dynamic range of this class of modulation systems. In other embodiments, the equalizing networks 14a, 14b can be provided after compressors 16a, 16b, to equalize the signals after compression.

Low pass filter circuits 18a, 18b can be included to provide a cutoff of high portions of the signal, and high pass filter circuits 20a, 20b providing a cutoff of low portions of the audio signals. In one exemplary embodiment, low pass filters 18a, 18b are used to cut signals higher than about 15-20 kHz, and high pass filters 20a, 20b are used to cut signals lower than about 20-200 Hz.

Figure 6:
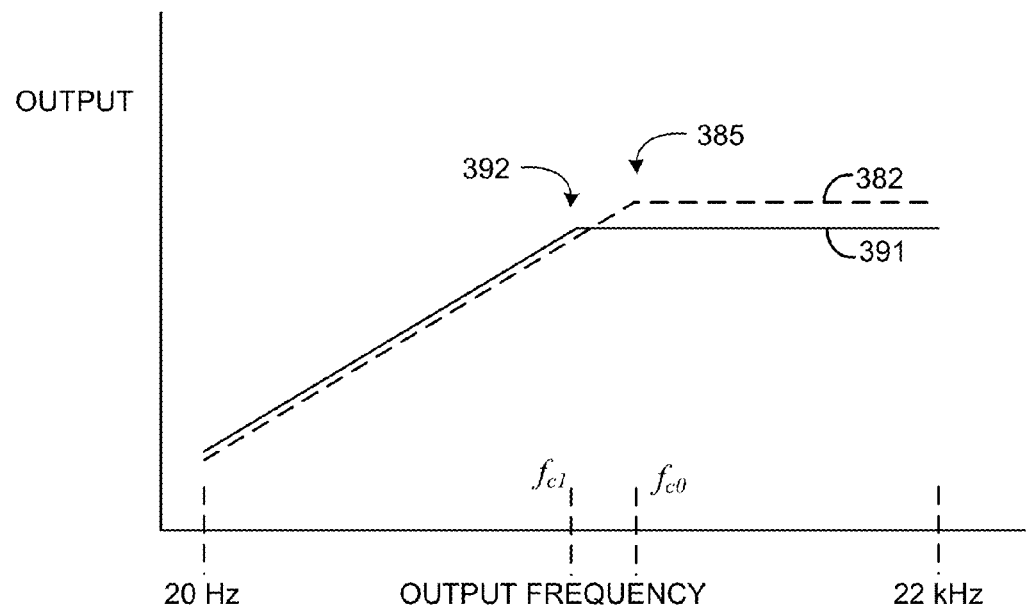
FIGS. 6 and 7 are diagrams illustrating examples of adaptive equalization to decrease the volume of delivered output. Particularly.

The high pass filters 20a, 20b can be configured to eliminate low frequencies that, after modulation, would result in deviation of carrier frequency (e.g., those portions of the modulated signal of FIG. 6 that are closest to the carrier frequency). Also, some low frequencies are difficult for the system to reproduce efficiently and as a result, much energy can be wasted trying to reproduce these frequencies. Therefore, high pass filters 20a, 20b can be configured to cut out these frequencies.

The low pass filters 18a, 18b can be configured to eliminate higher frequencies that, after modulation, could result in the creation of an audible beat signal with the carrier. By way of example, if a low pass filter cuts frequencies above 15 kHz, and the carrier frequency is approximately 44 kHz, the difference signal will not be lower than around 29 kHz, which is still outside of the audible range for humans. However, if frequencies as high as 25 kHz were allowed to pass the filter circuit, the difference signal generated could be in the range of 19 kHz, which is within the range of human hearing.

In the example system 10, after passing through the low pass and high pass filters, the audio signals are modulated by modulators 22a, 22b. Modulators 22a, 22b, mix or combine the audio signals with a carrier signal generated by oscillator 23. For example, in some embodiments a single oscillator (which in one embodiment is driven at a selected frequency of 40 kHz to 100 kHz) is used to drive both modulators 22a, 22b. By utilizing a single oscillator for multiple modulators, an identical carrier frequency is provided to multiple channels being output at 24a, 24b from the modulators. Using the same carrier frequency for each channel lessens the risk that any audible beat frequencies may occur.

High-pass filters 27a, 27b can also be included after the modulation stage. High-pass filters 27a, 27b can be used to pass the modulated ultrasonic carrier signal and ensure that no audio frequencies enter the amplifier via outputs 24a, 24b. Accordingly, in some embodiments, high-pass filters 27a, 27b can be configured to filter out signals below about 25 kHz.

Additional examples of ultrasonic audio systems, including parametric transducers and drivers, with which the technology disclosed herein may be implemented are disclosed in U.S. Pat. No. 8,718,297, titled Parametric Transducer and Related Methods, which is incorporated herein by reference in its entirety.

Conventional audio speakers rely on the movement of the speaker cone in the audible frequency range to reproduce audio content. Conventional speakers tend to have a relatively flat output across the usable frequency range (e.g., ~20 Hz-20 kHz), but with some roll-off on either end depending on the size and design. Ultrasonic emitters used with ultrasonic audio systems, on the other hand, are typically more efficient at higher frequencies, and therefore, need less power to produce sound at the high end. In other words, ultrasonic emitters tend to operate somewhat like a high pass filter, reproducing audio content more efficiently at higher frequencies than at lower frequencies. Systems and methods can be implemented to take advantage of this high-pass-filter-like effect by adjusting the equalization to change the output levels produced by the system. Embodiments can be implemented to increase or decrease the output level produced by the system without substantially changing the overall amount of power supplied by the amplifier, but instead by changing equalization to apply the power differently (e.g. adjust the gains) at different frequencies.

Figure 3:
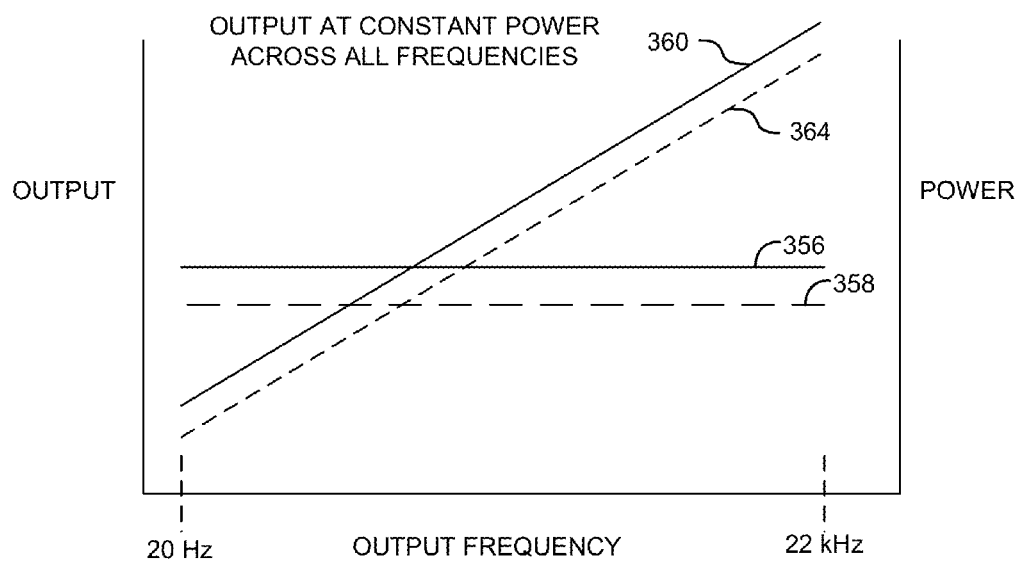
FIG. 3 is a diagram illustrating an example of an output of an ultrasonic emitter system in reproducing audio content.

FIG. 3 is a diagram illustrating an example of an output of an ultrasonic emitter in reproducing audio content. In this example, the resultant audio reproduction from the ultrasonic emitter increases linearly as a function of frequency for a constant level of input power 356. This linear increase is shown by line 360 on the chart. In some applications, this increase can be approximately 12 dB per octave, for example. It is noted that in practical applications, the output might not be perfectly linear, however it can be at least substantially linear.

Conventionally, adjustment of the audio output is accomplished by adjusting the power of the input signal up or down. Within the operational range of the signal amplifier and emitter, this results in an upward or downward shift of line 360 while retaining the linear nature of the output across the frequency range. Clipping or other phenomenon can occur to alter the linearity, however, increases or decreases in the attenuation are made while retaining the linear nature of the output across the frequency range. An example of this is shown by the dashed line 364, which shows an attenuated output 364 as compared to the original output 360. Dashed line 358 is included to show the corresponding decrease in power resulting in the attenuation of the output.

Because of this relatively steep increase in output as a function of frequency, ultrasonic audio systems can, in some applications, provide a somewhat unnatural audio reproduction. In other words, the high frequency sounds or reproduced at too high a volume as compared with the low-frequency sounds. Accordingly, some applications have applied equalization that reduces the amount of power dedicated to the high frequency to provide a more natural sound reproduction. An example of this is illustrated in FIG.

Figure 4:
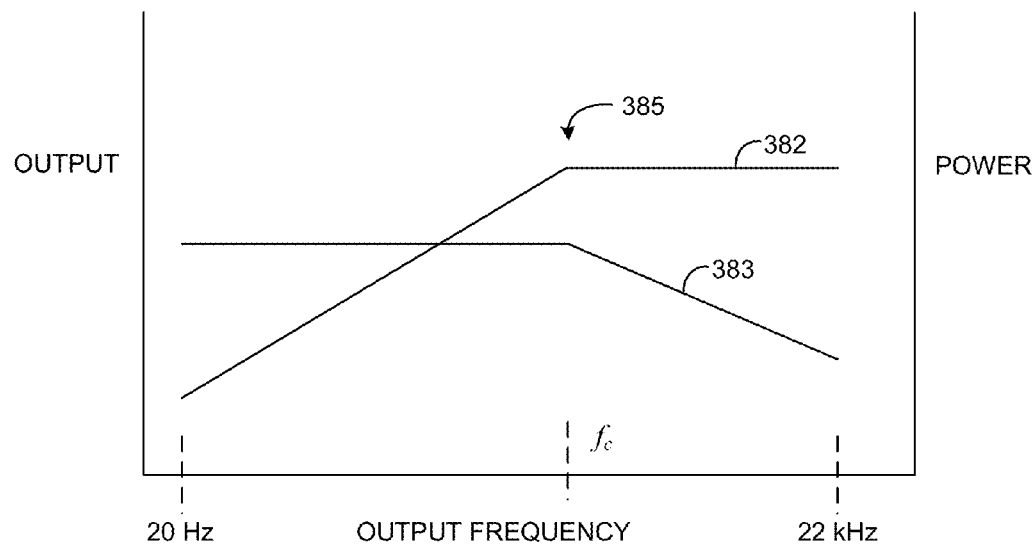
FIG. 4 illustrates an example of an output signal in which the amount of power supplied to higher frequencies is reduced.

4. FIG. 4 illustrates an example of a non-linear output signal in which the amount of power supplied to the higher frequencies is reduced. This can alter the otherwise linear response of the system. As seen by the example shown in FIG. 4, the equalization is adjusted such that the output 382 of the system has an inflection point 385 below a predetermined cutoff frequency, $f_c$, the output increases linearly as a function of frequency, and above the cutoff frequency, $f_c$, the output remains relatively flat over the remaining frequency range.

In some embodiments, the output may not be perfectly flat and some variation can be tolerated. For example, systems and methods can be implemented to achieve deviation from flat of approximately +/−3 db for frequencies above the inflection point, and others approximately +/−6 db for frequencies above the inflection point, although other variations are possible depending on the quality of sound desired with the understanding that less variation from a perfectly flat response is typically preferred. To anything other than a trained ear, a variation of around +/−3 dB will typically sound flat. Below the inflection point, the system may be configured to maintain power constant across the frequency range, but embodiments can be implemented in which no smoothing is used. Further embodiments can be configured to implement techniques such as pseudobass techniques, for example, or other processing using filtering/amplification or dsps to push low frequency content to higher frequencies.

An example of the power used to generate this output is illustrated by line 383. As seen by this example, the powers linear across the frequency range up to the cutoff frequency, fc. After this point, the power decreases so as to achieve a flat output at frequencies above the cutoff frequency, fc. In other embodiments, the power can be decreased nonlinearly as a function of frequency above the cutoff frequency. For example, the power can be decreased as a step function, in a stepwise fashion downward as a function of frequency, exponentially as a function of frequency, or other nonlinear relationship as a function of frequency. Preferably, the objective of the power decreases to achieve a relatively flat output as a function of frequency. However, other output characteristics can be attained including, for example, a more gentle increase (a less-steep slope) above the inflection point, the decrease above the inflection point, or other response curve. Also other frequency bands may be adjusted to achieve desired effects, for example, persons with hearing loss at certain frequency bands.

Figure 5:
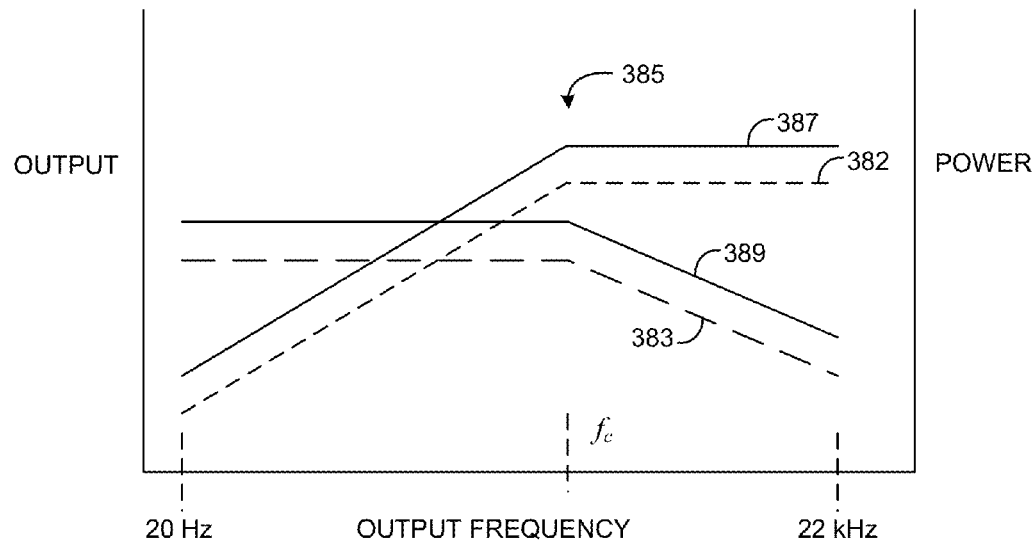
FIG. 5 is a diagram illustrating an example of a nonlinear output signal at a reduced attenuation.

Normally, in order to change the attenuation of the output equalized so as to have an inflection point such as that illustrated in FIG. 4, the power is adjusted uniformly across the frequency range. As such, the output increases or decreases uniformly across the frequency range. An example of this is shown in FIG. 5 in which the original output is illustrated by the dashed line 382, and the adjusted (increased in this example) output is illustrated by line 387. In this example, the attenuation was decreased, increasing the output uniformly across the frequency range. Inflection point 385 remains at the same frequency. This is further illustrates, power is increased from the original power settings 383 to the new power settings 389.

In any real world audio system, there are practical limits to the amount of power that can be applied to increase the output. For example, amplifiers are only capable of delivering a certain level of power without clipping or otherwise distorting. As a consequence, the attenuation can only be decreased by a finite amount before distortion occurs, or before the amplifier simply runs out of power. Thus, the output is constrained. Likewise, the ultrasonic emitters can only handle so much power before distorting or overheating, thus also constraining output.

While the audio output may never truly be unlimited in real-world applications, systems and methods can be implemented to provide adaptive equalization to allow the output to be increased above that which can be achieved with systems operating as described with reference to FIGS. 4 and 5. Because of the linear increase in output as a function of frequency, more volume is achieved at higher frequencies with the same amount of applied power. To aid in the description, consider a simple example of an ultrasonic audio system that has an approximately linear increase in output as a function frequency, at approximately 12 dB per octave. Such a system is approximately 90 times more efficient at 4 kHz than it is at 1 kHz. In other words, in this example, with a linear output to provide equal loudness across the frequency spectrum approximately 1% of the power is used to deliver the output at 4 kHz and above, and 90% of the power is used to deliver the output at 1 kHz and below. The remaining 9% is used in the frequency range between 1 kHz and 4 kHz.

Accordingly, embodiments of the systems and methods disclosed herein may be configured to increase the power delivered to the higher frequency signals and take away a corresponding amount of power from the lower frequency signals to increase overall output. In this manner, the overall output can be increased without increasing the overall power demand on the amplifier (i.e., the amplifier power remains the same or substantially the same). Accordingly, output can be increased without materially increasing distortion introduced by the amplifier. At the top end, output can be increased without introducing amplifier clipping. Using the above example, moving just 1% of the power from 1 khz and below to 4 khz and above results in a doubling of the high frequency (1% to 2%) volume, while only reducing the volume below 1 khz by 1.11% (90% to 89%).

In further embodiments, the overall output power of the system can be adjusted by changing the inflection point on the output curve. For example, the output can be attenuated by changing the frequency, $f_c$, of the inflection point to a lower frequency, thereby reducing the output of the high-frequency signals (above the new inflection point, $f_c$), and increasing the range of frequencies at this lowered output. Similarly, the system volume can be increased by changing the frequency, $f_c$, of the inflection point to a higher frequency, thereby increasing the output of the high-frequency signals (above the new inflection point, $f_c$).

Figure 7:
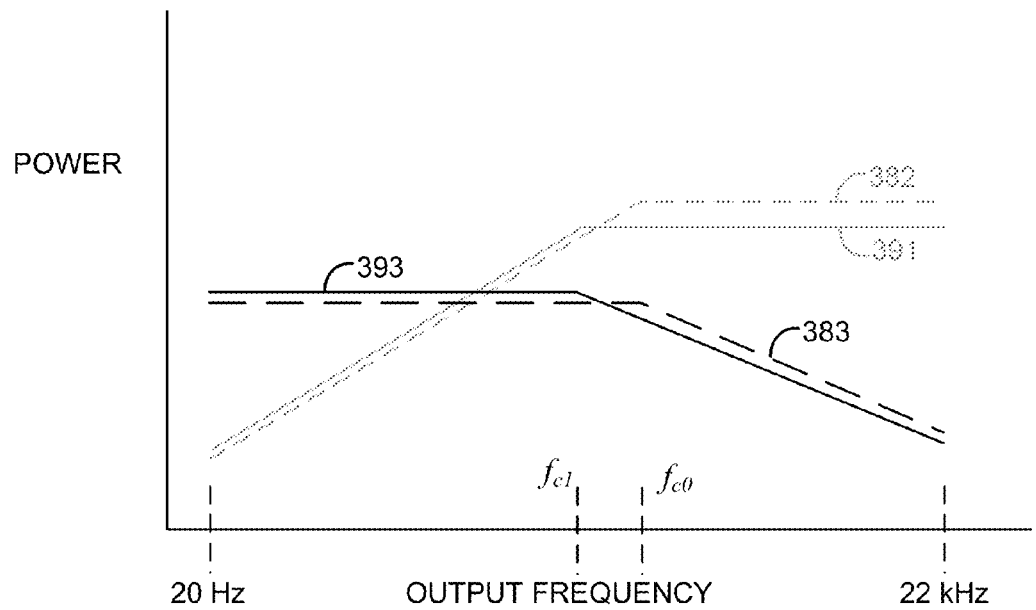

FIGS. 6 and 7 are diagrams illustrating examples of adaptive equalization to decrease the volume of delivered output in accordance with one embodiment of the systems and methods disclosed herein. Particularly, FIG. 6 is a diagram illustrating the output of the system as a function of frequency, and FIG. 7 is a diagram illustrating an example of an adaptive equalization scheme to control power (which can also include compression).

In the example illustrated in FIG. 6 the inflection point, $f_c$, is lowered from its original frequency denoted as, $f_{c0}$, to its new frequency denoted as, $f_{c1}$. The original attenuation setting is shown by dashed line 382, with the original inflection point at 385. For purposes of continuity of discussion, this corresponds to line 382 in FIGS. 4 and 5. As seen in FIG. 6, the attenuated output shown by line 391 as a new inflection point 392 at frequency $f_{c1}$. As seen in this example, the output of frequencies above the original inflection point, $f_{c0}$, are reduced from their original level, and the output of frequencies between the new inflection point 392 (at frequency $f_{c1}$) and the prior pre-attenuated inflection point 385 (at frequency $f_{c0}$) is flattened and also reduced. Accordingly, the corresponding power delivered to the output above the new inflection point frequency, $f_{c1}$, is reduced. The power delivered to the output below $f_{c1}$ one can remain constant at its pre-attenuated level, producing more relative low frequency output. Alternatively, as illustrated in FIG. 6, the power delivered to the output below $f_{c1}$ can be increased resulting in a slightly greater output at those lower frequencies. In some embodiments, this can occur as a result of the compression module (e.g., compression module 16a, 16b) applying gain to return the signal to full-scale. In some embodiments, the amount of power increase provided to the lower frequencies below the inflection point can be the same amount as the decrease in power provided to the higher frequencies above the inflection point. Accordingly, the amplifier can be configured to operate at an ideal or preferred power setting, and the output attenuated by adjusting the inflection point in the equalization provided across the frequency range.

FIG. 7 is a diagram illustrating an example of an adjustment in power used to achieve the attenuation illustrated in FIG. 6. As shown in this example, the original power curve 383 shows a constant power delivered up to the original inflection point, $f_{c0}$, and a linear decrease in power above that inflection point to flatten the output 382. With attenuation, the decrease in power begins with frequencies above the new inflection point, $f_{c1}$, as shown by power curve 393. As this also illustrates, in this example the amount of power dedicated to frequencies below the new inflection point, $f_{c1}$, is slightly increased.

As this example illustrates, if the volume desired is decreased (e.g., in response to a user lowering the volume of the system), the adaptive equalization moves the inflection point of the frequency response downward. In other words, the high frequency content of the input is attenuated, but the low frequency content is not. Because the total attenuation of the signal is increased, the compressor module can be configured to apply a small amount of gain to bring the signal back to full scale (e.g., a target or determined level, which can be specified in decibels of full scale (dBFS)) after the EQ. The net result is lower output of high frequency content, and a slight increase in the low-end content (albeit very modest). Total frequency response is still as flat as possible (most musical), but more low-end content is included, thereby producing more relative low frequency output.

Figure 8:
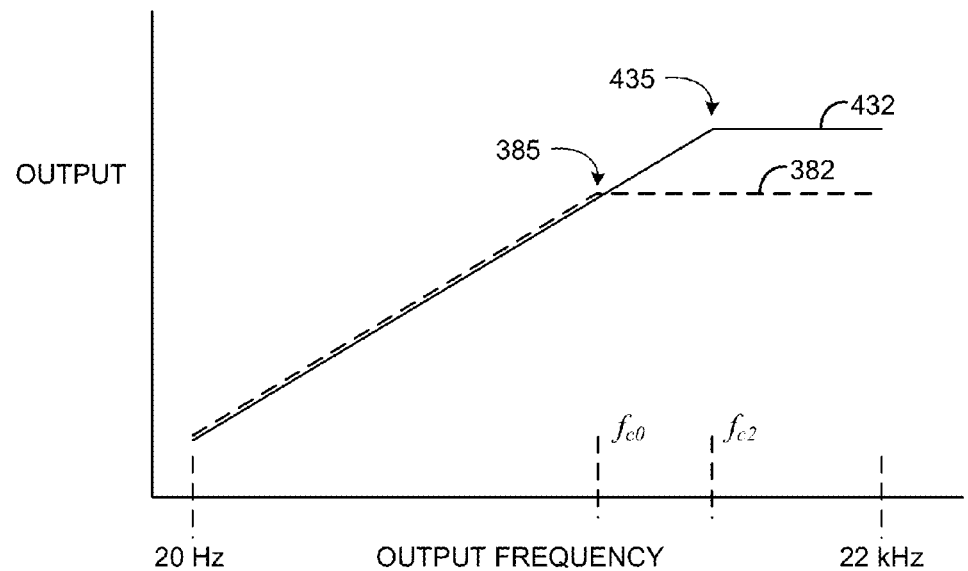
FIGS. 8 and 9 are diagrams illustrating examples of adaptive equalization to increase the volume of delivered output. Particularly.
Figure 9:
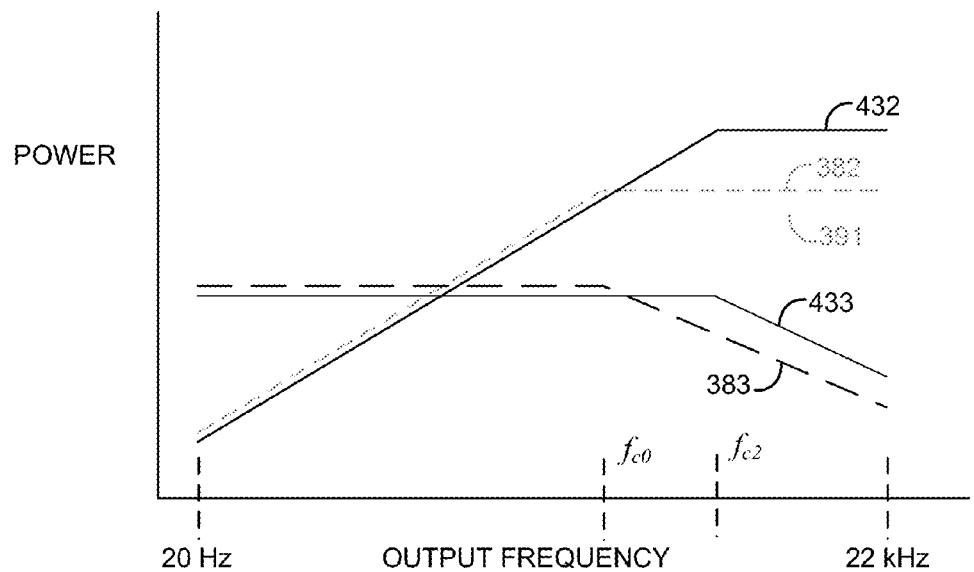

FIGS. 8 and 9 are diagrams illustrating examples of adaptive equalization to increase the volume of delivered output in accordance with one embodiment of the systems and methods disclosed herein. Particularly, FIG. 8 is a diagram illustrating the output of the system as a function of frequency, and FIG. 9 is a diagram illustrating an example of an adaptive equalization scheme to control power (which can also include compression).

With reference now to FIG. 8, it is seen in this example that to increase the volume output by the system, the inflection point is raised from original inflection point 385 at frequency, $f_{c0}$, to new inflection point 435 at frequency, $f_{c1}$, where $f_{c2} > f_{c0}$.

As seen in this example, the audio output level for the frequencies between the new inflection point 435 (at frequency $f_{c2}$) and the prior pre-attenuated inflection point 385 (at frequency $f_{c0}$) continues to increase linearly as a function of frequency. However, the audio output level for the frequencies above the new inflection point 435 (at frequency $f_{c2}$) are held constant.

Accordingly, the corresponding power delivered to the audio signal for frequencies above the new inflection point frequency, $f_{c1}$, is increased. This is shown by power curve 433 relative to the original power curve 382. The power delivered to the audio signal for frequencies below $f_{c1}$ can remain constant at or near the pre-attenuated level. Alternatively, as illustrated in FIG. 6, the power delivered to the output below $f_{c2}$ can be decreased resulting in a slightly lower output at those lower frequencies. In some embodiments, this can be included as part of the adaptive equalization controlling the gains of the various frequency bands. In other embodiments, this can occur as a result of the compression module (e.g., compression module 16a, 16b) decrease in gain to maintain the signal at full-scale. In some embodiments, the amount of power decrease provided to the lower frequencies below the inflection point can be the same amount as the decrease in power provided to the higher frequencies above the inflection point. Accordingly, the amplifier can be configured to operate at an ideal or preferred power setting, and the output volume increased by adjusting the inflection point in the equalization provided across the frequency range.

As this example illustrates, in some embodiments, when the user turns up the volume of the system, the inflection point of the frequency response is moved up. The high frequency content of the input is attenuated less. To avoid clipping, the compressor module attenuates the resulting signal slightly. The net result is that the high frequency content is greatly increased while the low frequency content is only slightly decreased. Because of the +12 dB/octave response, the efficiency of the high frequency content allows only a small shift from low to high frequency to have a dramatic effect in volume output by the system.

The range of inflection points for a given system can vary. For example, in some embodiments, it can range from 200 Hz to 10 kilohertz. Smaller emitters such as those sized for tablet or cell phone use generally need higher inflection points say ranging from 2 to 10 khz. Large emitters such as those sized for home speakers can go as low as 200 Hz but should still allow for an inflection point to say 2 khz to accommodate loud environments.

It is noted that the change is illustrated in FIGS. 6, 7, 8 and 9 are not necessarily to scale and may be shown at exaggerated relative levels to illustrate the concept. In reality, changes in power delivery and output may be less dramatic, depending on the application and environment.

In some embodiments, an upper volume threshold can be defined such that, for example, when the volume is increased above the upper volume threshold amount, the system transitions from adaptive equalization and applies gain equally, or substantially equally, across the frequency band. And, when the volume is returned to a setting below the upper volume threshold amount, the system transitions back to the adaptive equalization mode in which the inflection point is adjusted. Likewise, in some embodiments, a lower volume threshold can be defined such that, for example, when the volume is decreased below the lower volume threshold amount, the system transitions from adaptive equalization and applies attenuation (reduces gain) equally, or substantially equally, across the frequency band. And, when the volume is returned to a setting above the lower volume threshold amount, the system transitions back to the adaptive equalization mode in which the inflection point is adjusted.

Because of the linear or approximately linear output of the system, a doubling of the volume provided by the high-frequency signals (e.g. 4 kHz and above) can give the impression to the user that the volume of the entire frequency range is doubled. Accordingly, in some embodiments, an increase of power delivered to the high-frequency range (above the inflection point) is offset by an equal or substantially equal decrease in power delivered to the low frequency range (below the inflection point). This can have the effect of increasing the volume (sound pressure level) output by the system without increasing amount of power required by the amplifier.

Consider again the above example where an equalized volume is achieved by delivering 1% of the power to frequencies at 4 kHz and above in the remaining 90% of the power that frequencies 1 kHz and below. In this example, doubling the output of the system at the high frequencies requires an additional 1% of power. Taking this same amount of power away from the low frequencies reduces the power supplied to the low frequencies from 90% to 89%. Accordingly, the power delivered to the high frequencies is doubled (a change from 1% to 2%) while the power delivered to the low frequencies only decreases by 1.111% (a change from 90% to 89%), which is a negligible amount. Adjustments to the inflection point are not necessary, but can be included to provide a more pleasant or natural sounding output. Depending on the system output this can correspond to, for example, an increase in output of the high frequencies from 80 dB to 83 dB with a corresponding decrease of the low frequencies from 80 dB to 79.9 dB.

In some embodiments, adaptive equalization can be extended to include equalization across system components that include conventional audio speakers. For example, an ultrasonic audio system can further include a conventional woofer or subwoofer used to generate low-frequency audio content at audible frequencies. The adaptive equalization can be configured to provide additional power to the woofer or subwoofer, which may be more efficient than the ultrasonic emitter at low frequencies. Accordingly, to compensate for power being removed from the low frequencies to be provided to the high frequencies, additional power can be removed from the low frequencies and provided to drive the woofer or subwoofer to compensate for the loss of output low frequencies. In further embodiments, the crossover frequency for the woofer or subwoofer can be increased such the woofer or subwoofer is used to drive frequencies above what would otherwise be used to drive to help compensate for the lower power provided to the low frequencies of the ultrasonic audio system. For example, the woofer or subwoofer can be configured to handle some of the output for frequencies in the range of 500 Hz to 1 kHz to fill in the bass or low frequency response for the ultrasonic audio system.

Figure 10:
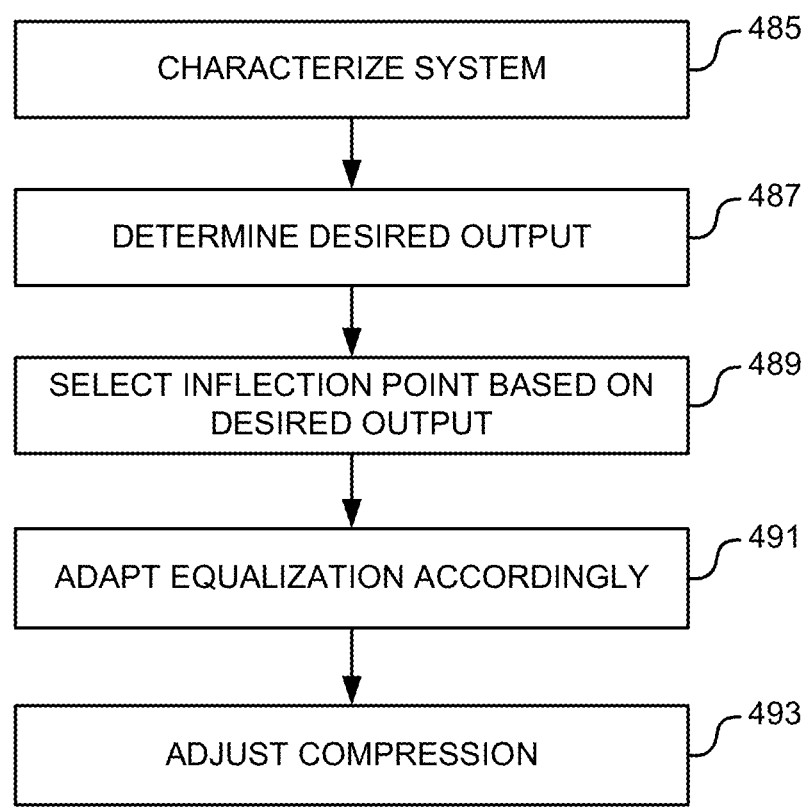
FIG. 10 is a diagram illustrating an example process for adaptive equalization that can be implemented in accordance with one embodiment of the systems and methods disclosed herein.

FIG. 10 is a diagram illustrating an example process for adaptive equalization in accordance with one embodiment of the systems and methods disclosed herein. With reference now to FIG. 10, the system is characterized. For example, in various embodiments, this can include determining the output response of the ultrasonic audio system over the anticipated frequency range (e.g. 20 Hz to 20,000 kHz). The characterization can also include determining various inflection points for predetermined output levels.

In operation, the system can respond to adjustments to the volume (attenuation) control made by a user of the ultrasonic audio system. For example, the user may adjust the volume knob up or down to increase or decrease, respectively, the volume of the system. In response to a volume setting, the signal representing adjustments to the volume (i.e. changes in attenuation) are provided to the system, and the system determines the desired output volume. This is illustrated at operation 487. In response to this, at operation 489 the system selects an inflection point based on the desired output volume. For example, in inflection point can be chosen as described above with reference to FIGS. 6-9 to provide a hockey-stick-like appearance in the output curve. Correspondingly, at operations 491 and 493 equalization and compression are adjusted to correspond to the output curve defined by the inflection point. As noted above, the equalization can be adjusted to direct more or less power to the frequencies above the inflection point to adjust the volume output by the system. Likewise, a corresponding decrease or increase in power can be made to the frequencies below the inflection point. Compression can be used to maintain the output at full-scale.

Accordingly, systems and methods can be implemented to avoid amplifier clipping or other distortion of the result of over-driving the system. Volume can be increased by changing the equalization to provide slight increases to power at the high frequencies (which can have a high relative impact to the volume output by the system) with a corresponding decrease to power at the low frequencies (which can have a smaller relative impact).

The effectiveness of the systems and methods disclosed herein may be more pronounced in electrostatic ultrasonic emitters, which tend to have a fairly linear response characteristics. However, these techniques can also be applied to PVDF emitters and other ultrasonic emitters due to the non-linear demodulation in air, which is more efficient and high frequencies.

Figure 11:
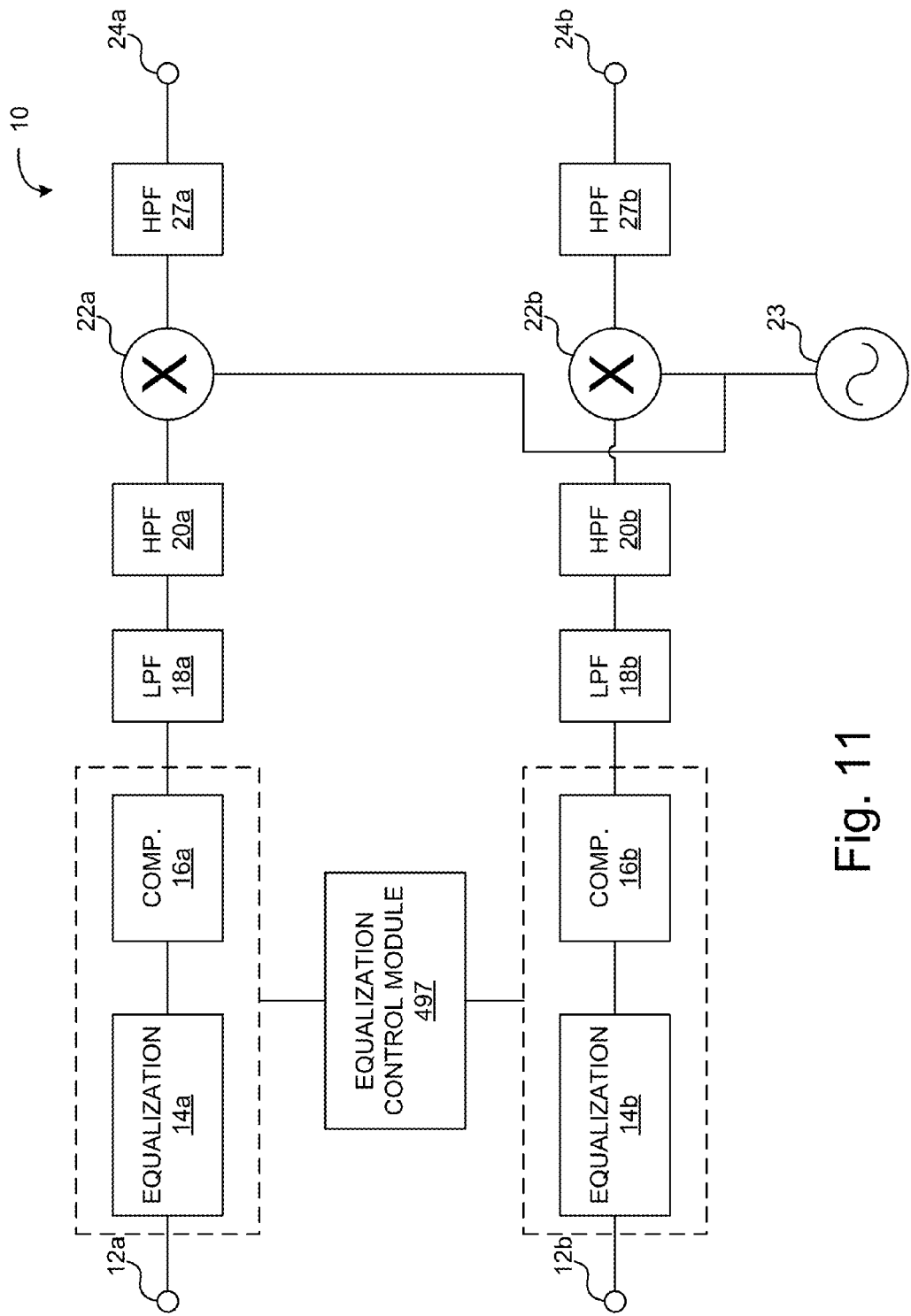
FIG. 11 is a diagram illustrating an example implementation of an adaptive equalization control module used to control equalization and compression in a system such as that shown in FIG. 2.

As one of ordinary skill in the art would appreciate, processing of audio content for an ultrasonic audio system (such as the audio processing shown in FIG. 2) can be performed in the analog domain or in the digital domain, or a combination thereof. For processing in the digital domain, modules to perform functions such as equalization, compression, filtering and modulation can be implemented using hardware, software, or a combination of the two. For example, one or more digital signal processors can be used to carry out these functions. To carry out the adaptive equalization functions described herein, additional functionality can be included to control the equalization module (e.g., equalization 14 of FIG. 2) and the compression module (e.g. compression 16 of FIG. 2) can be controlled in some embodiments using adaptive equalization control module. FIG. 11 is a diagram illustrating an example implementation of an adaptive equalization control module used to control equalization and compression in a system such as that shown in FIG. 2. With reference now to FIG. 11, equalization control module 497 can be included in implemented to perform the functions described herein such as, for example, adjusting the equalization applied to the audio content to adjust the inflection point of the output curve in response to changes in attenuation (e.g., user adjustments to volume). In various embodiments, the compression occurs to provide a full-scale output can be accomplished using conventional compression techniques without adjustment. In other embodiments, adaptive equalization control module 497 can also adjust the compression applied to the audio content.

For example, equalization can be implemented using hardware or software filters that can adjust the loudness of individual frequencies or frequency ranges. These filters can allow more power or less power to be used for each specific frequency or frequency range controlled by the equalizer. Accordingly, in various embodiments, equalization control module 497 can be implemented to control the filters used in the equalization module to decrease power to or increase power to (cut or boost, respectively) specific frequency bands. Any of a number of different frequency bands can be identified and controlled to allow adjustment of the power above and below inflection points, and to set an inflection point, in accordance with the techniques described above.

Figure 12:
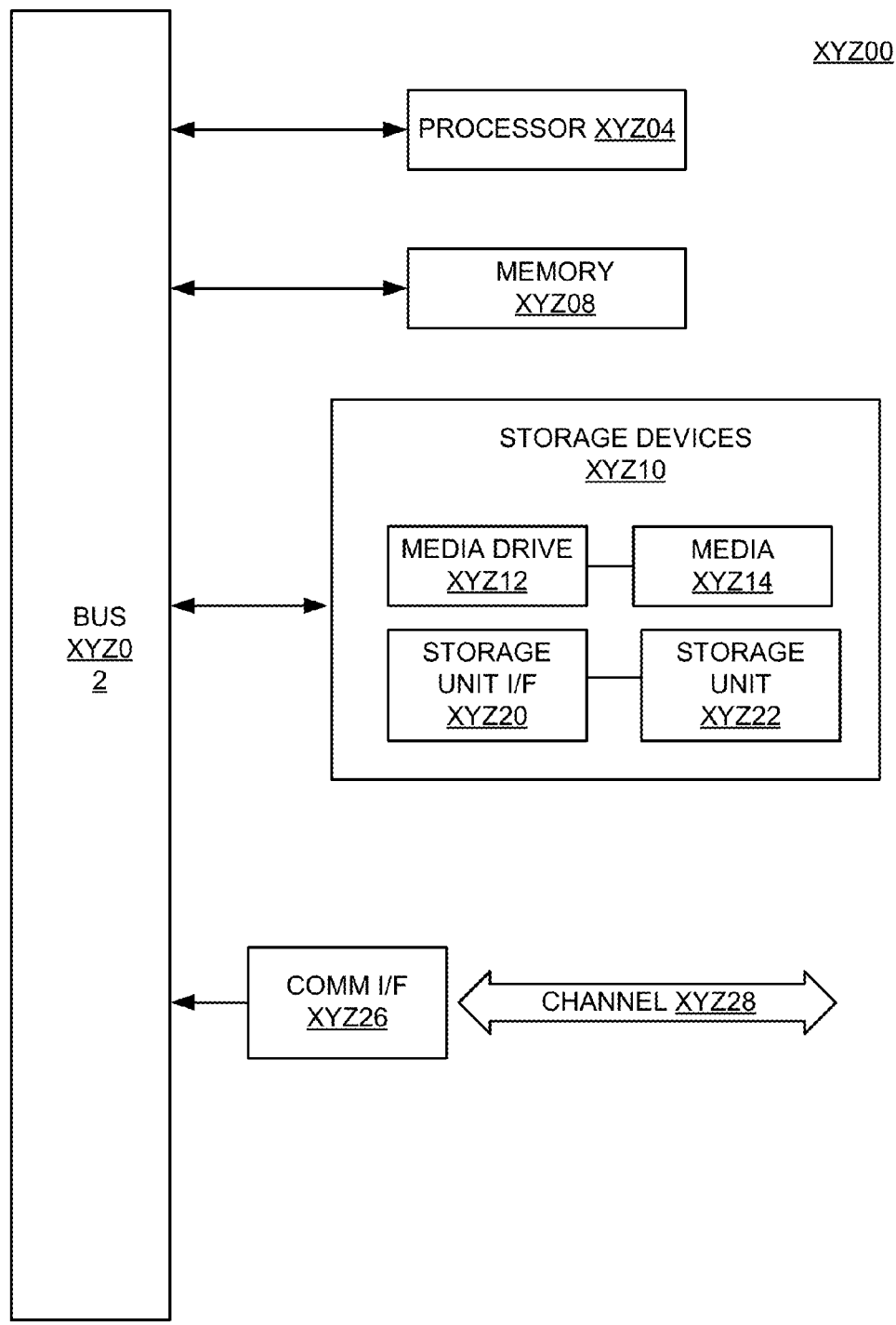
FIG. 12 illustrates an example computing module that may be used in implementing various features of embodiments of the disclosed technology.

As used herein, the term module might describe a given unit of functionality that can be performed in accordance with one or more embodiments of the technology disclosed herein. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the technology are implemented in whole or in part using software, in one embodiment, these software elements can be implemented to operate with a computing or processing module capable of carrying out the functionality described with respect thereto. One such example computing module is shown in FIG. 12. Various embodiments are described in terms of this example-computing module 500. After reading this description, it will become apparent to a person skilled in the relevant art how to implement the technology using other computing modules or architectures.

Referring now to FIG. 12, computing module 500 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 500 might also represent computing capabilities embedded within or otherwise available to a given device such as, for example, processors memory and other components used to form all or part of an audio processing system. Such a computing module might also be found in other electronic devices such as, for example, digital cameras, navigation systems, cellular telephones, portable computing devices, and other electronic devices that might include some form of processing capability.

Computing module 500 might include, for example, one or more processors, controllers, control modules, or other processing devices, such as a processor 504. Processor 504 might be implemented using a general-purpose or special-purpose processing engine such as, for example, a microprocessor, controller, or other control logic. In the illustrated example, processor 504 is connected to a bus 502, although any communication medium can be used to facilitate interaction with other components of computing module 500 or to communicate externally.

Computing module 500 might also include one or more memory modules, simply referred to herein as main memory 508. For example, preferably random access memory (RAM) or other dynamic memory, might be used for storing information and instructions to be executed by processor 504. Main memory 508 might also be used for storing temporary variables or other intermediate information during execution of instructions to be executed by processor 504. Computing module 500 might likewise include a read only memory ("ROM") or other static storage device coupled to bus 502 for storing static information and instructions for processor 504.

The computing module 500 might also include one or more various forms of information storage mechanism 510, which might include, for example, a media drive 512 and a storage unit interface 520. The media drive 512 might include a drive or other mechanism to support fixed or removable storage media 514. For example, a hard disk drive, a floppy disk drive, a magnetic tape drive, an optical disk drive, a CD or DVD drive (R or RW), or other removable or fixed media drive might be provided. Accordingly, storage media 514 might include, for example, a hard disk, a floppy disk, magnetic tape, cartridge, optical disk, a CD or DVD, or other fixed or removable medium that is read by, written to or accessed by media drive 512. As these examples illustrate, the storage media 514 can include a computer usable storage medium having stored therein computer software or data.

In alternative embodiments, information storage mechanism 510 might include other similar instrumentalities for allowing computer programs or other instructions or data to be loaded into computing module 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory module) and memory slot, a PCMCIA slot and card, and other fixed or removable storage units 522 and interfaces 520 that allow software and data to be transferred from the storage unit 522 to computing module 500.

Computing module 500 might also include a communications interface 524. Communications interface 524 might be used to allow software and data to be transferred between computing module 500 and external devices. Examples of communications interface 524 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 524 might typically be carried on signals, which can be electronic, electromagnetic (which includes optical) or other signals capable of being exchanged by a given communications interface 524. These signals might be provided to communications interface 524 via a channel 528. This channel 528 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 508, storage unit 520, media 514, and channel 528. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 500 to perform features or functions of the disclosed technology as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for adapting equalization in an ultrasonic audio system, comprising:
    receiving an electronic audio signal representing audio content, and applying determined amounts of gain or attenuation to specific frequency bands of the electronic audio signal;
    receiving an input signal representing an attenuation setting for the ultrasonic audio system;
    determining an inflection point for an equalizer of the audio processing system based on the attenuation setting; and
    controlling the amount of gain applied to the audio signal above the inflection point to achieve a flat output for frequencies above the inflection point, and controlling the amount of gain applied to the audio signal below the inflection point to maintain constant power across the frequencies below the inflection point,
    wherein controlling the amount of gain applied to the audio signal above the inflection point and controlling the amount of gain applied to the audio signal below the inflection point comprises: changing the amount of power applied to the audio signal for frequencies above the inflection point and making a corresponding but opposite change to the amount of power applied to the audio signal for frequencies below the inflection point.

2. The method of claim 1, further comprising adjusting the gain of the electronic audio signal after equalization to bring the electronic audio signal to a determined full-scale level.

3. The method of claim 1, further comprising modulating the electronic audio signal onto an ultrasonic carrier and delivering the modulated electronic audio signal to an ultrasonic emitter, wherein the ultrasonic emitter launches an ultrasonic pressure wave representing the modulated electronic audio signal.

4. The method of claim 1, further comprising adjusting the inflection point to a higher frequency in response to a user increasing a volume control of the ultrasonic audio system.

5. The method of claim 1, further comprising adjusting the inflection point to a lower frequency in response to a user decreasing a volume control of the ultrasonic audio system.

6. The method of claim 5, further comprising adjusting the gain of the electronic audio signal after equalization to increase the electronic audio signal to a determined full scale level.

7. The method of claim 1, further comprising characterizing the ultrasonic audio system to determine the system's output as a function of frequency at a given power setting.

8. The method of claim 1, wherein the electronic audio signal modulated onto the ultrasonic carrier comprise frequencies below the inflection point and frequencies above the inflection point.

9. An ultrasonic audio system, comprising:
an equalizer;
a compressor; and
a controller configured to adjust settings of the equalizer to control the amount of power provided to specific frequency bands of an audio signal, wherein controlling the amount of power provided to specific frequency bands comprises setting an inflection point for equalization, adjusting gain of the audio signal above the inflection point to achieve a flat output for frequencies above the inflection point, and adjusting the gain of the audio signal below the inflection point to maintain constant power across the frequencies below the inflection point
wherein adjusting the gain of the audio signal above the inflection point and adjusting the gain of the audio signal below the inflection point comprises: changing the amount of power applied to the audio signal for frequencies above the inflection point and making a corresponding but opposite change to the amount of power applied to the audio signal for frequencies below the inflection point.

10. The ultrasonic audio system of claim 9, wherein the compressor is configured to adjust the gain of the audio signal after equalization to provide the audio signal to a determined full-scale level.

11. The ultrasonic audio system of claim 9, further comprising a modulator configured to modulate the electronic audio signal onto an ultrasonic carrier, and an ultrasonic emitter configured to launch an ultrasonic pressure wave representing the modulated electronic audio signal.

12. The ultrasonic audio system of claim 9, wherein the controller is further configured to adjust the inflection point to a higher frequency in response to a user increasing a volume control of the ultrasonic audio system.

13. The ultrasonic audio system of claim 9, wherein the controller is further configured to adjust the inflection point to a lower frequency in response to a user decreasing a volume control of the ultrasonic audio system.

14. The ultrasonic audio system of claim 13, wherein the compressor is further configured to adjust the gain of the electronic audio signal after equalization to increase the electronic audio signal to a determined full scale level.

15. The ultrasonic audio system of claim 11, the electronic audio signal modulated onto the ultrasonic carrier comprise frequencies below the inflection point and frequencies above the inflection point.

* * * * *